United States Patent
Matsuo et al.

(10) Patent No.: US 7,167,027 B2
(45) Date of Patent: Jan. 23, 2007

(54) LATCH-TYPE LEVEL CONVERTER AND RECEIVER CIRCUIT ACCURATELY AMPLIFYING LOW-AMPLITUDE SIGNALS AND RECEIVING COMMON-MODE INPUT SIGNALS HIGHER THAN A SUPPLY VOLTAGE

(75) Inventors: Shinichiro Matsuo, Kawasaki (JP); Hideki Takauchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 59 days.

(21) Appl. No.: 10/405,636

(22) Filed: Apr. 3, 2003

(65) Prior Publication Data

US 2003/0201800 A1    Oct. 30, 2003

(30) Foreign Application Priority Data

Apr. 24, 2002  (JP) .............................. 2002-122513

(51) Int. Cl.
*G01R 19/00* (2006.01)
(52) U.S. Cl. ............................ 327/57; 327/52; 327/212
(58) Field of Classification Search ................. 327/57, 327/65, 90, 96, 199, 200, 203, 208, 210–212, 327/214, 215, 227–229, 333, 427, 437; 326/62, 326/63, 68, 80–83
See application file for complete search history.

(56) References Cited

U.S. PATENT DOCUMENTS

| | | | | |
|---|---|---|---|---|
| 4,982,111 A * | 1/1991 | Nakaizumi | ................... | 327/208 |
| 5,041,740 A * | 8/1991 | Smith | .......................... | 327/212 |
| 5,272,389 A * | 12/1993 | Hatada | ....................... | 327/306 |
| 5,399,917 A * | 3/1995 | Allen et al. | ................. | 327/436 |
| 5,656,951 A * | 8/1997 | Hu et al. | ...................... | 326/81 |
| 5,748,025 A * | 5/1998 | Ng et al. | ..................... | 327/333 |
| 5,760,619 A * | 6/1998 | Yamaguchi | .................. | 327/110 |
| 5,786,722 A * | 7/1998 | Buhler et al. | ................ | 327/503 |
| 5,880,617 A * | 3/1999 | Tanaka et al. | ............... | 327/333 |
| 5,929,656 A * | 7/1999 | Pagones | ...................... | 326/83 |
| 6,060,919 A * | 5/2000 | Wilson et al. | .............. | 327/143 |
| 6,081,153 A | 6/2000 | Hamada et al. | | |
| 6,147,514 A * | 11/2000 | Shiratake | ...................... | 327/55 |
| 6,255,861 B1 * | 7/2001 | Zhang | .......................... | 327/51 |
| 6,333,662 B1 * | 12/2001 | Umezawa et al. | .......... | 327/333 |
| 6,411,545 B1 * | 6/2002 | Caywood | ............... | 365/185.07 |
| 6,522,164 B2 * | 2/2003 | Barnes | ......................... | 326/27 |
| 6,580,411 B1 * | 6/2003 | Kubota et al. | ................ | 345/98 |
| 6,670,939 B2 * | 12/2003 | Yang et al. | ................... | 345/98 |

(Continued)

FOREIGN PATENT DOCUMENTS

JP    57-054428    3/1982

(Continued)

*Primary Examiner*—Timothy P. Callahan
*Assistant Examiner*—Hai L. Nguyen
(74) *Attorney, Agent, or Firm*—Arent Fox PLLC

(57) ABSTRACT

A latch-type level converter has a signal-input transistor, a latch, and a clock-input transistor. The signal-input transistor, which is a high-voltage transistor, receives an input signal, and the latch holds data of the input signal received by the signal-input transistor. The clock-input transistor controls the operation in accordance with a clock. According to the latch-type level converter, not only can low-amplitude signals be accurately amplified, but also input signals having a common-mode voltage higher than the supply voltage can be received.

7 Claims, 13 Drawing Sheets

U.S. PATENT DOCUMENTS 6,703,863 B2 * 3/2004 Gion .......................... 326/62
6,762,957 B2 * 7/2004 Hsu et al. ............... 365/189.05

FOREIGN PATENT DOCUMENTS

| JP | 63-105522 | 5/1988 |
| JP | 11-103240 | 4/1999 |
| JP | 2000-224011 | 8/2000 |
| JP | 2000-306382 | 11/2000 |

* cited by examiner

LATCH-TYPE LEVEL CONVERTER AND RECEIVER CIRCUIT ACCURATELY AMPLIFYING LOW-AMPLITUDE SIGNALS AND RECEIVING COMMON-MODE INPUT SIGNALS HIGHER THAN A SUPPLY VOLTAGE

CROSS REFERENCE TO RELATED APPLICATION

This application is based upon and claims the benefit of priority from the prior Japanese Patent Application No. 2002-122513, filed on Apr. 24, 2002, the entire contents of which are incorporated herein by reference.

BACKGROUND OF THE INVENTION

1. Field of the Invention

The present invention relates to a latch-type level converter and a receiver circuit and, more particularly, to a latch-type level converter for use in a receiver circuit in a signal transmission system, a semiconductor storage device, or the like.

2. Description of the Related Art

Recently, the processing speed required of an information processing apparatus has been steadily increasing and, along with this trend, there has developed a need to increase the speed of signal transmission within an LSI (Large Scale Integration Circuit) or between LSIs forming the information processing apparatus. For high-speed signal transmission, signals are often transmitted at low amplitude levels in order to suppress signal reflections and prevent the loss of high-frequency components.

Specifically, in recent semiconductor manufacturing technology, the device size has been decreasing and the integration level has been increasing, and the need for higher signal transmission speed, involving reducing signal amplitude levels, etc., has been increasing; with this trend, the transistors forming a latch-type level converter, for example, are each formed as a low voltage transistor by reducing the thickness of its gate oxide film. Further, if input signals having a common-mode voltage higher than the supply voltage are fed to a latch-type level converter, signal-input transistors receiving input signals are subjected to a voltage higher than their breakdown voltages.

In this case, the receiver circuit must be equipped with a circuit capable of accurately amplifying low-amplitude signals. Furthermore, depending on the system, there are cases where a common-mode input signal higher than the supply voltage is input; in view of this, there is a need to provide a latch-type level converter that can receive such a high common-mode input signal.

The prior art and its associated problem will be described in detail later with reference to relevant drawings.

SUMMARY OF THE INVENTION

An object of the present invention is to provide a latch-type level converter that can accurately amplify a low-amplitude signal, and can receive a common-mode input signal higher than the supply voltage.

According to the present invention, there is provided a latch-type level converter comprising a signal-input transistor receiving an input signal, a latch holding data of the input signal received by the signal-input transistor, and a clock-input transistor controlling operation in accordance with a clock, wherein the signal-input transistor is a high-voltage transistor.

Further, according to the present invention, there is provided a receiver circuit comprising a latch-type level converter, a latch circuit latching an output of the latch-type level converter, and a clock generating circuit generating a clock to be supplied to the latch-type level converter, wherein the latch-type level converter comprises a signal-input transistor receiving an input signal, a latch holding data of the input signal received by the signal-input transistor, and a clock-input transistor controlling operation in accordance with a clock of the n-phase clocks, wherein the signal-input transistor is a high-voltage transistor.

The input signal may be a differential input signal, and the signal-input transistor may be a differential transistor pair which receives the differential input signal at control electrodes. The latch may be a differential latch. The differential latch may be a pair of cross-coupled inverters. The clock-input transistor may be an nMOS transistor which receives the clock at a gate, and the signal-input transistor may be a pair of nMOS transistors.

The latch, the signal input nMOS transistors, and the clock input nMOS transistor may be connected in series in this order between a high-level power supply line and a low-level power supply line. The latch may be a pair of cross-coupled inverters, and a pMOS transistor which receives the clock at a gate may be connected in parallel with each pMOS transistor in the pair of inverters.

The clock-input transistor may be a pMOS transistor which receives the clock at a gate, and the signal-input transistor may be a pair of pMOS transistors. The clock input pMOS transistor, the signal input pMOS transistors, and the latch may be connected in series in this order between a high-level power supply line and a low-level power supply line.

The latch may be a pair of cross-coupled inverters. The latch-type level converter may further comprise an nMOS transistor receiving the clock at a gate, which is connected in parallel with each nMOS transistor in the pair of inverters.

The clock may be a differential clock, the clock-input transistor may comprise an nMOS transistor and a pMOS transistor which receive the differential clock at each gate, and the signal-input transistor may comprise a pair of pMOS transistors and a pair of nMOS transistors. The clock input pMOS transistor, the signal input pMOS transistors, the latch, the clock input nMOS transistor, and the signal input nMOS transistors may be connected in series in this order between a high-level power supply line and a low-level power supply line.

There may be a number, n, of the latch-type level converters and the same number, n, of the latch circuits, where n is an integer not smaller than 2, and the n latch-type level converters may be respectively driven by n-phase clocks that the clock generating circuit outputs.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before proceeding to the detailed description of the embodiments of a latch-type level converter according to the present invention, a prior art latch-type level converter and its associated problem will be described with reference to drawings.

Figure 1:
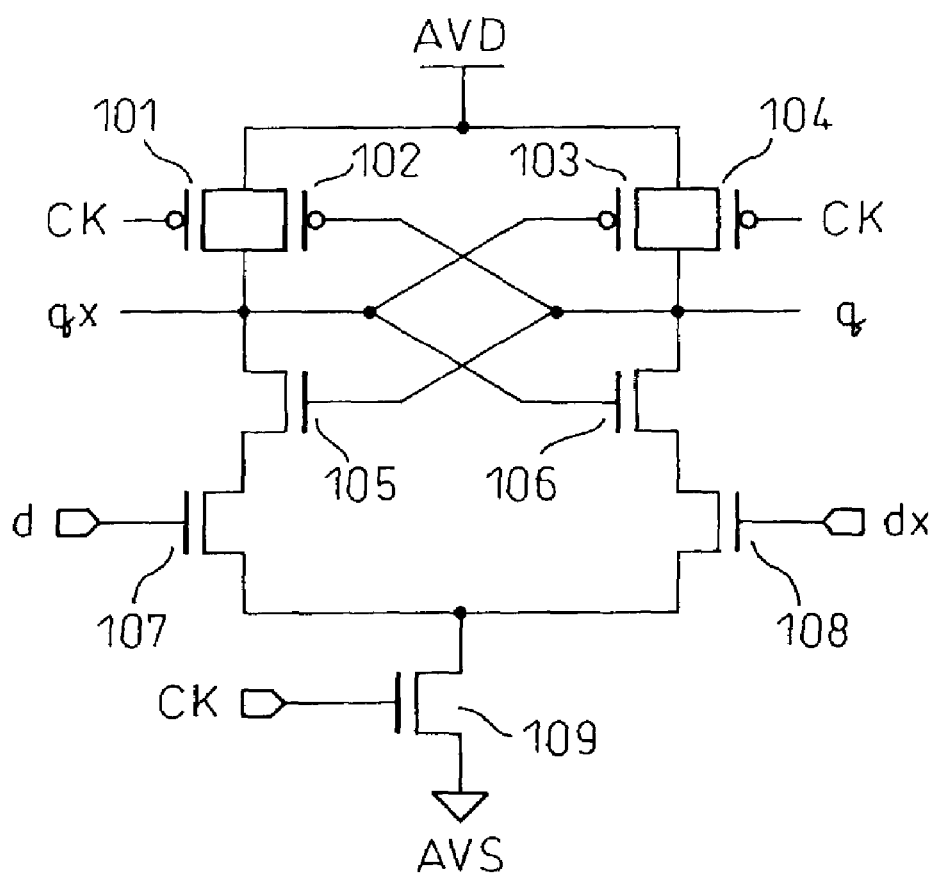
FIG. 1 is a circuit diagram showing one example of a latch-type level converter according to the prior art.

FIG. 1 is a circuit diagram showing one example of the prior art latch-type level converter; a StrongARM latch-type differential sense amplifier circuit is shown here. In FIG. 1, reference character AVD is a high-level power supply line (high-level supply voltage), AVS is a low-level power supply line (low-level supply voltage), CK is a clock, d and dx are differential (complementary) input signals, and q and qx are differential output signals. Here, the letter "x" indicates an inverted level signal; for example, the signals dx and qx are inverted versions of the signals d and q, respectively.

As shown in FIG. 1, the prior art latch-type level converter comprises p-channel MOS transistors (pMOS transistors) 101 to 104 and n-channel MOS transistors (nMOS transistors) 105 to 109. The nMOS transistors 107 and 108 are signal-input transistors (differential pair transistors) whose gates are supplied with the differential input signals d and dx, respectively, while the nMOS transistor 109 is a clock-input transistor which is turned on/off by the clock CK supplied at its gate and thereby controls the operation of the circuit.

The pMOS transistors 102 and 103 and the nMOS transistors 105 and 106 together constitute a latch for latching the input signals d and dx received by the respective signal-input transistors 107 and 108. That is, the latch is constructed from a pair of cross-coupled inverters, i.e., the first inverter (transistors 102 and 105) and the second inverter (transistors 103 and 106), and the differential outputs qx and q of the latch-type level converter are taken at the outputs of the first and second inverters.

Here, the pMOS transistors 101 and 104 connected in parallel with the respective pMOS transistors 102 and 103 in the first and second inverters are precharge transistors, which are on when the clock CK is at a low level "L", and pull up the respective outputs qx and q to the high-level supply voltage AVD.

Figure 2:
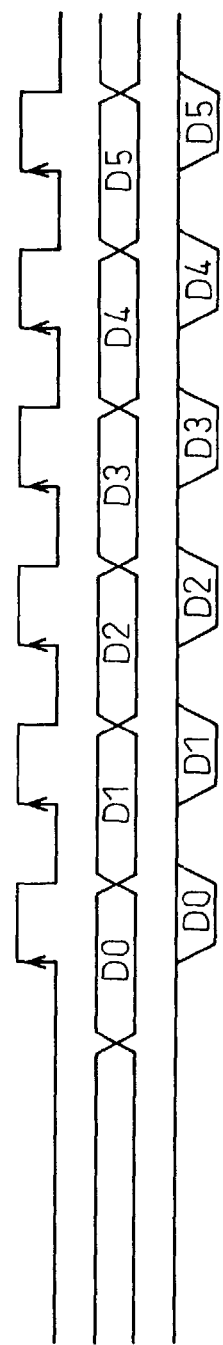
FIG. 2 is a timing diagram for explaining the operation of the latch-type level converter shown in FIG. 1.

FIG. 2 is a timing diagram for explaining the operation of the latch-type level converter shown in FIG. 1.

As shown in FIGS. 1 and 2, when the clock CK is at the low level "L", the nMOS transistor 109 is off and the pMOS transistors 101 and 104 turn on, precharging the differential outputs q and qx to the high level "H". When the clock CK rises from the low level "L" to the high level "H", the nMOS transistor 109 turns on and the circuit is activated (current path from the high-level power supply line AVD to the low-level power supply line AVS is formed); at this time, the potential difference between the input signals d and dx causes a difference between the currents flowing through the signal-input transistors 107 and 108, and the potentials at the output nodes (output signals q and qx) exhibit different values in relationships corresponding to the differential input signals d and dx.

Further, since the output nodes (q and qx) are not only the outputs but also the inputs of the cross-coupled first and second inverters, the output signals q and qx are amplified to the level of the high-level supply voltage AVD (high level "H") or the level of the low-level supply voltage AVS (low level "L") in corresponding relationship to the input signals d and dx, and are held (latched) in that state during the high level "H" period of the clock CK.

More specifically, data D0, D1, D2, . . . of the input signals d and dx are latched via the signal-input transistors 107 and 108 by the rising edge of the clock CK, and are held by the latch (transistors 102, 105; 103, 106) during the high level "H" period of the clock CK, and the output signals q and qx corresponding to the data D0, D1, D2, . . . are output. On the other hand, when the clock CK is at the low level "L", the transistors 101 and 104 are on and the output signals q and qx are raised to the high-level supply voltage AVD (high level "H").

During the low level "L" period of the clock CK and after signal determination, the latch-type level converter (StrongARM latch-type differential sense amplifier) is used by shutting off the shoot-through current. The differential output signals q and qx from the latch-type level converter are supplied, for example, to an SR latch connected at a subsequent stage.

With recent advances in semiconductor manufacturing technology, the device (transistor) size has been decreasing and the integration level has been increasing, and the need for higher signal transmission speed, involving reducing signal amplitude levels, etc., has been increasing; with this trend, the transistors forming the latch-type level converter, for example, are each formed as a low voltage transistor by reducing the thickness of its gate oxide film.

As a result, if input signals d and dx having a common-mode voltage higher than the supply voltage are fed to the StrongARM latch-type differential sense amplifier (latch-type level converter) shown in FIG. 1, for example, the signal-input transistors 107 and 108 that receive the input signals d and dx at their gates are subjected to a voltage higher than their breakdown voltages, resulting in deterioration of the signal-input transistors and, in some cases, leading to breakdown of their gates.

Embodiments of a latch-type level converter according to the present invention will be described in detail below with reference to the accompanying drawings.

Figure 3:
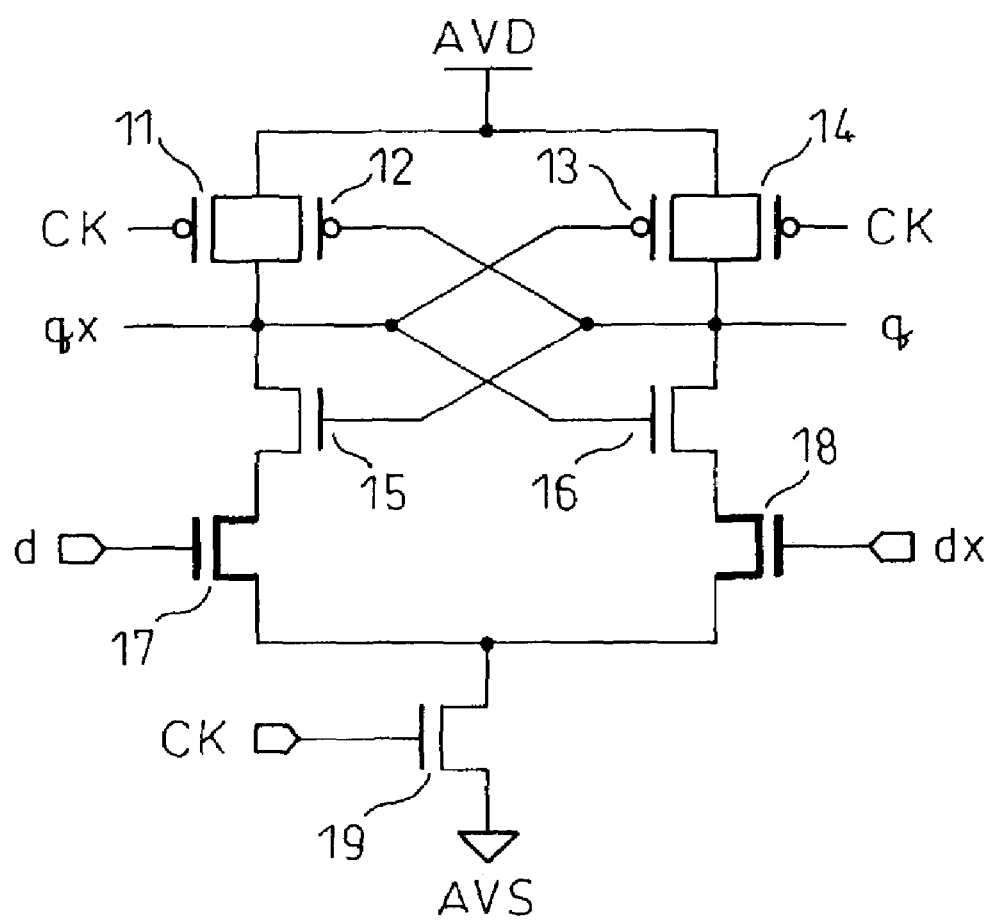
FIG. 3 is a circuit diagram showing a first embodiment of a latch-type level converter according to the present invention.

FIG. 3 is a circuit diagram showing a first embodiment of the latch-type level converter according to the present invention; a StrongARM latch-type differential sense amplifier circuit is shown here. In FIG. 3, reference character AVD is a high-level power supply line (high-level supply voltage), AVS is a low-level power supply line (low-level supply voltage), CK is a clock, d and dx are differential (complementary) input signals, and q and qx are differential output signals.

As is apparent from a comparison between FIG. 3 and FIG. 1, the circuit configuration of the latch-type level converter of the first embodiment is the same as that of the latch-type level converter described with reference to FIG. 1. That is, in the latch-type level converter of the first embodiment, pMOS transistors 11 to 14 and nMOS transistors 15 to 19 correspond to the pMOS transistors 101 to 104 and the nMOS transistors 105 to 109 in the prior art latch-type level converter shown in FIG. 1.

The only difference is that, in the latch-type level converter of the first embodiment, the signal-input transistors (differential pair transistors) 17 and 18 that receive the input signals d and dx at their gates are each constructed from a high-voltage transistor. That is, the nMOS transistors 17 and 18 are formed as high-voltage transistors, for example, by increasing their gate oxide films.

As a result, even when input signals d and dx having a common-mode voltage higher than the supply voltage are applied, deterioration of the signal-input transistors 17 and 18 does not occur, and the gate breakdown of the signal-input transistors 17 and 18 can be prevented. Thus, according to the latch-type level converter of the first embodiment, not only can low-amplitude signals be accurately amplified, but also input signals having a common-mode voltage higher than the supply voltage can be received.

Figure 4:
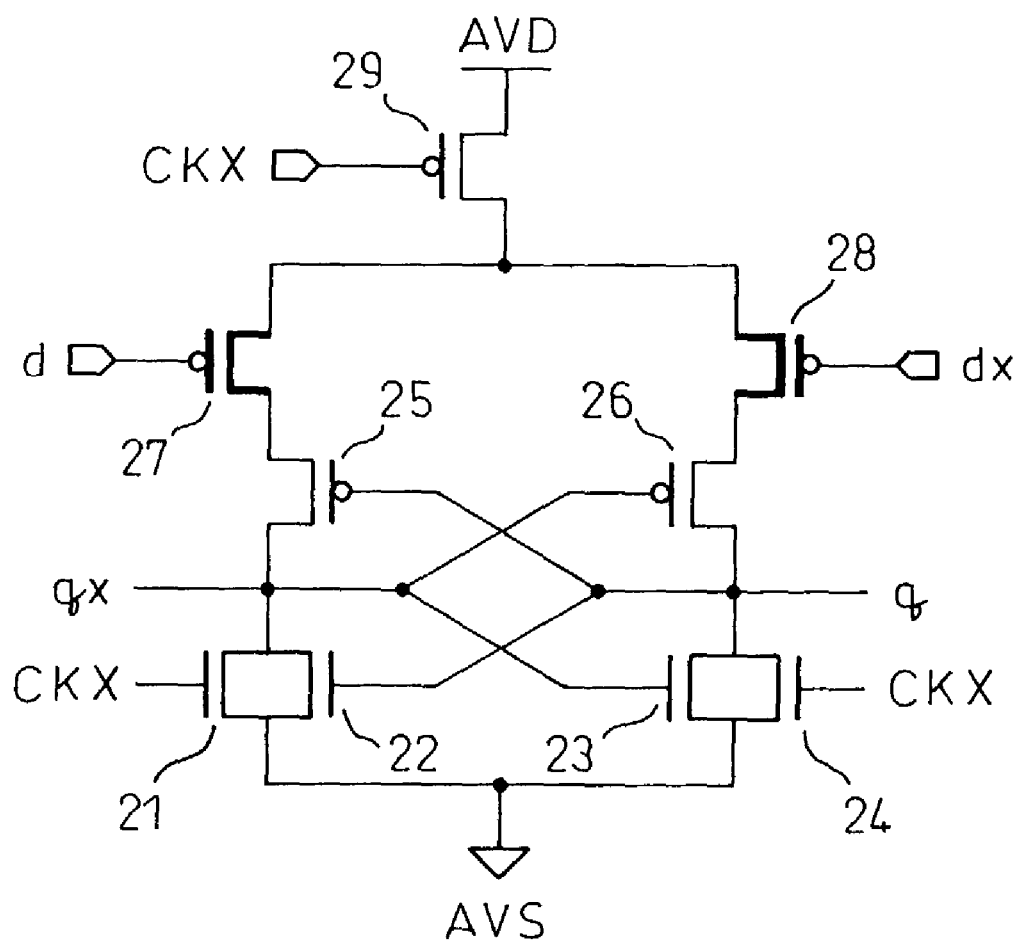
FIG. 4 is a circuit diagram showing a second embodiment of a latch-type level converter according to the present invention.
Figure 5:
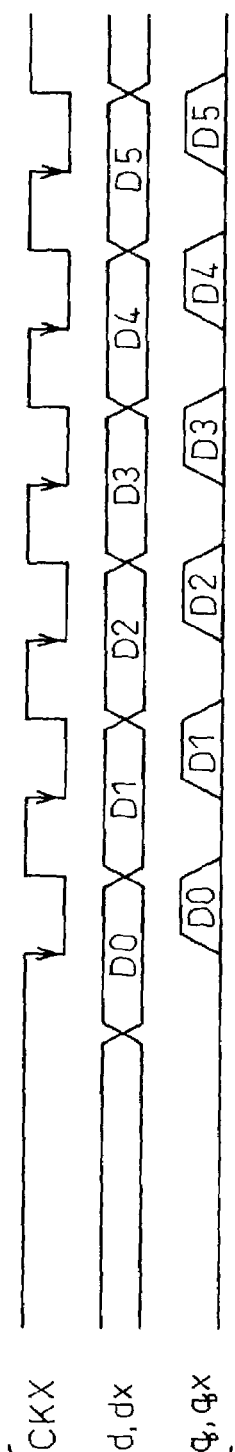
FIG. 5 is a timing diagram for explaining the operation of the latch-type level converter shown in FIG. 4.

FIG. 4 is a circuit diagram showing a second embodiment of the latch-type level converter according to the present invention, and FIG. 5 is a timing diagram for explaining the operation of the latch-type level converter shown in FIG. 4.

As is apparent from a comparison between FIG. 4 and FIG. 3 (FIG. 1), the latch-type level converter of the second embodiment differs from the above-described first embodiment in that the conductivity type of each transistor is opposite from that of the corresponding transistor in the first embodiment.

More specifically, the latch-type level converter of the second embodiment comprises pMOS transistors (signal-input transistors) 27 and 28 whose gates are supplied with differential input signals d and dx, a pMOS transistor 29 which is turned on/off by the clock CKX supplied at its gate and thereby controls the operation of the circuit, a latch constructed from a pair of cross-coupled inverters (the first inverter consisting of an nMOS transistor 22 and a pMOS transistor 25, and the second inverter consisting of an nMOS transistor 23 and a pMOS transistor 26), and nMOS transistors 21 and 24 connected in parallel with the respective nMOS transistors 22 and 23 in the first and second inverters. Here, the nMOS transistors 21 and 24 turn on when the clock CKX is at a high level "H", and thus pull down the respective outputs qx and q to the low-level supply voltage AVS.

FIG. 5 is a timing diagram for explaining the operation of the latch-type level converter shown in FIG. 4.

As shown in FIGS. 4 and 5, when the clock CKX is at the high level "H", the pMOS transistor 29 is off and the nMOS transistors 21 and 24 turn on, precharging (predischarging) the differential outputs q and qx to the low level "L". When the clock CKX falls from the high level "H" to the low level "L", the pMOS transistor 29 turns on and the circuit is activated (current path from the high-level power supply line AVD to the low-level power supply line AVS is formed); at this time, the potential difference between the input signals d and dx causes a difference between the currents flowing through the signal-input transistors 27 and 28, and the potentials at the output nodes (q and qx) exhibit different values in corresponding relationship to the differential input signals d and dx.

Further, as the output nodes (q and qx) are not only the outputs but also the inputs of the cross-coupled first and second inverters, the output signals q and qx are amplified to the level of the high-level supply voltage AVD (high level "H") or the level of the low-level supply voltage AVS (low level "L") in relationships corresponding to the input signals d and dx, and are held in that state during the low level "L" period of the clock CKX.

More specifically, data D0, D1, D2, . . . of the input signals d and dx are latched via the signal-input transistors 27 and 28 by the falling edge of the clock CKX, and are held by the latch (transistors 22, 25; 23, 26) during the low level "L" period of the clock CKX, and the output signals q and qx corresponding to the data D0, D1, D2, . . . are output. On the other hand, when the clock CKX is at the high level "H", the transistors 21 and 24 are on and the output signals q and qx are held to the low-level supply voltage AVS (low level "L").

In the latch-type level converter of the second embodiment, the signal-input transistors (differential pair transistors) 27 and 28 that receive the input signals d an dx are each constructed from a high-voltage transistor. That is, the pMOS transistors 27 and 28 are formed as high-voltage transistors, for example, by increasing their gate oxide films.

As a result, even when input signals d and dx having a common-mode voltage higher than the supply voltage are applied, deterioration of the signal-input transistors 27 and 28 does not occur, and the gate breakdown of the signal-input transistors 27 and 28 can be prevented. Thus, according to the latch-type level converter of the second embodiment, not only can low-amplitude signals be accurately amplified, but also input signals having a common-mode voltage higher than the supply voltage can be received.

Figure 6:
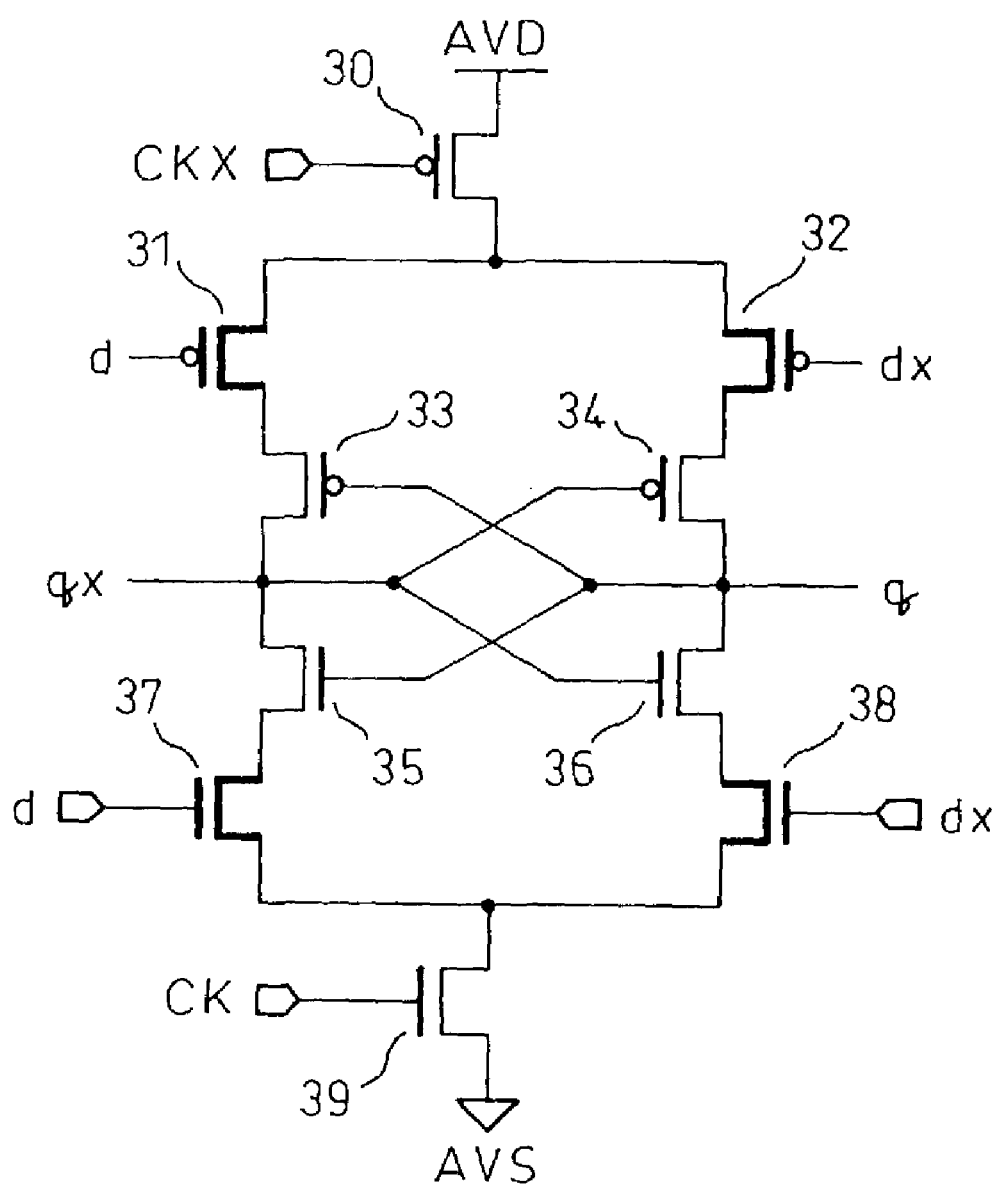
FIG. 6 is a circuit diagram showing a third embodiment of a latch-type level converter according to the present invention.

FIG. 6 is a circuit diagram showing a third embodiment of the latch-type level converter according to the present invention.

As is apparent from a comparison between FIG. 6 and FIGS. 3 and 4, the latch-type level converter of the third embodiment is a combination of the first embodiment shown in FIG. 3 and the second embodiment shown in FIG. 4. However, the precharge (discharge) transistors are eliminated.

As shown in FIG. 6, the latch-type level converter of the third embodiment comprises a first clock-input transistor (pMOS transistor) 30 whose gate is supplied with a clock CKX, first signal-input transistors (pMOS transistors 31 and 32) whose gates are supplied with differential input signals d and dx, a latch constructed from a pair of inverters (the first inverter consisting of an nMOS transistor 35 and a pMOS transistor 33, and the second inverter consisting of an nMOS transistor 36 and a pMOS transistor 34), second signal-input transistors (nMOS transistors 37 and 38) whose gates are supplied with the input signals d and dx, and a second clock-input transistor (nMOS transistor) 39 whose gate is supplied with a clock CK; these elements are connected between the high-level power supply line AVD and the low-level power supply line AVS in the order stated above.

In the latch-type level converter of the third embodiment, the first signal-input transistors 31 and 32 and the second signal-input transistors 37 and 38, whose gates are supplied with the input signals d and dx, are each constructed from a high-voltage transistor.

Figure 7:
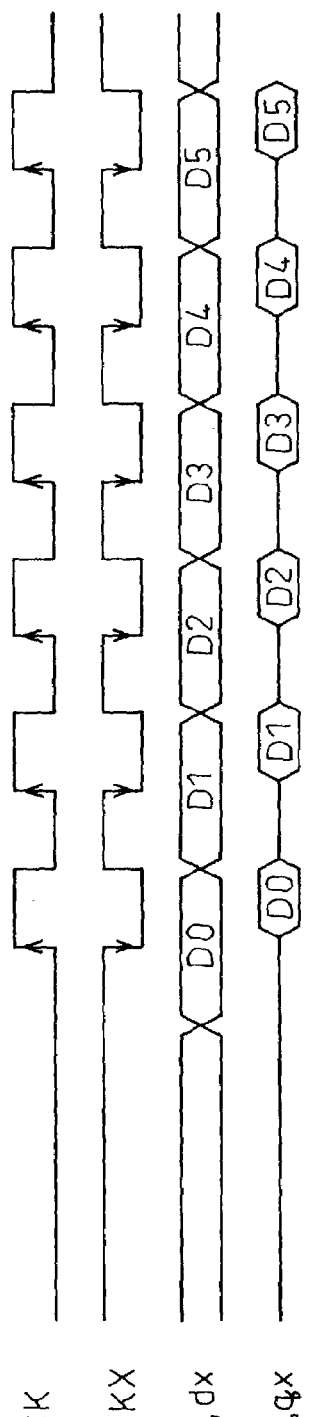
FIG. 7 is a timing diagram for explaining the operation of the latch-type level converter shown in FIG. 6.

FIG. 7 is a timing diagram for explaining the operation of the latch-type level converter shown in FIG. 6.

As shown in FIGS. 6 and 7, when the clock CK is at the low level "L", and the clock CKX is at the high level "H", the nMOS transistor 39 and the pMOS transistor 30 are off. When the clock CK rises from the low level "L" to the high level "H", and the clock CKX falls from the high level "H" to the low level "L", the nMOS transistor 39 and the pMOS transistor 30 turn on and the circuit is activated, that is, a current path from the high-level power supply line AVD to the low-level power supply line AVS is formed. At this time, the potential difference between the input signals d and dx causes a difference between the currents flowing through the first signal-input transistors 31 and 32 and between the currents flowing through the second signal-input transistors 37 and 38, and the potentials at the output nodes (output signals q and qx) exhibit different values in corresponding relationship to the differential input signals d and dx.

Further, as the output nodes (q and qx) are not only the outputs but also the inputs of the cross-coupled first and second inverters, the output signals q and qx are amplified to the level of the high-level supply voltage AVD (high level "H") or the level of the low-level supply voltage AVS (low level "L") in corresponding relationship to the input signals d and dx, and are held in that state during the period when the clock CK is at the high level "H" and the clock CKX is at the low level "H".

More specifically, data D0, D1, D2, . . . of the input signals d and dx are latched via the first and second signal-input transistors 31, 32 and 37, 38 by the falling edge of the clock CKX which coincides with the rising edge of the clock CK, and are held by the latch (transistors 33, 35; 34, 36) during the period when the clock CK is at the high level "H" and the clock CKX is at the low level "H", and the output signals q and qx corresponding to the data D0, D1, D2, . . . are output. On the other hand, when the clock CK is at the low level "L" and the clock CKX is at the high level "H", the clock-input transistors 30 and 39 are off, so that the output signals q and qx become indeterminate.

In this way, even when input signals d and dx having a common-mode voltage higher than the supply voltage are applied, deterioration of the signal-input transistors 31, 32 and 37, 38 does not occur, and the gate breakdown of the signal-input transistors 31, 32 and 37, 38 can be prevented. Thus, according to the latch-type level converter of the third embodiment, not only can low-amplitude signals be accurately amplified, but also input signals having a common-mode voltage higher than the supply voltage can be received.

As described above, in each of the embodiments of the present invention, since the signal-input transistors are high-voltage transistors, the transistors can be operated within a region where gate breakdown does not occur, and this serves to improve the fabrication yield of the circuit.

Figure 8:
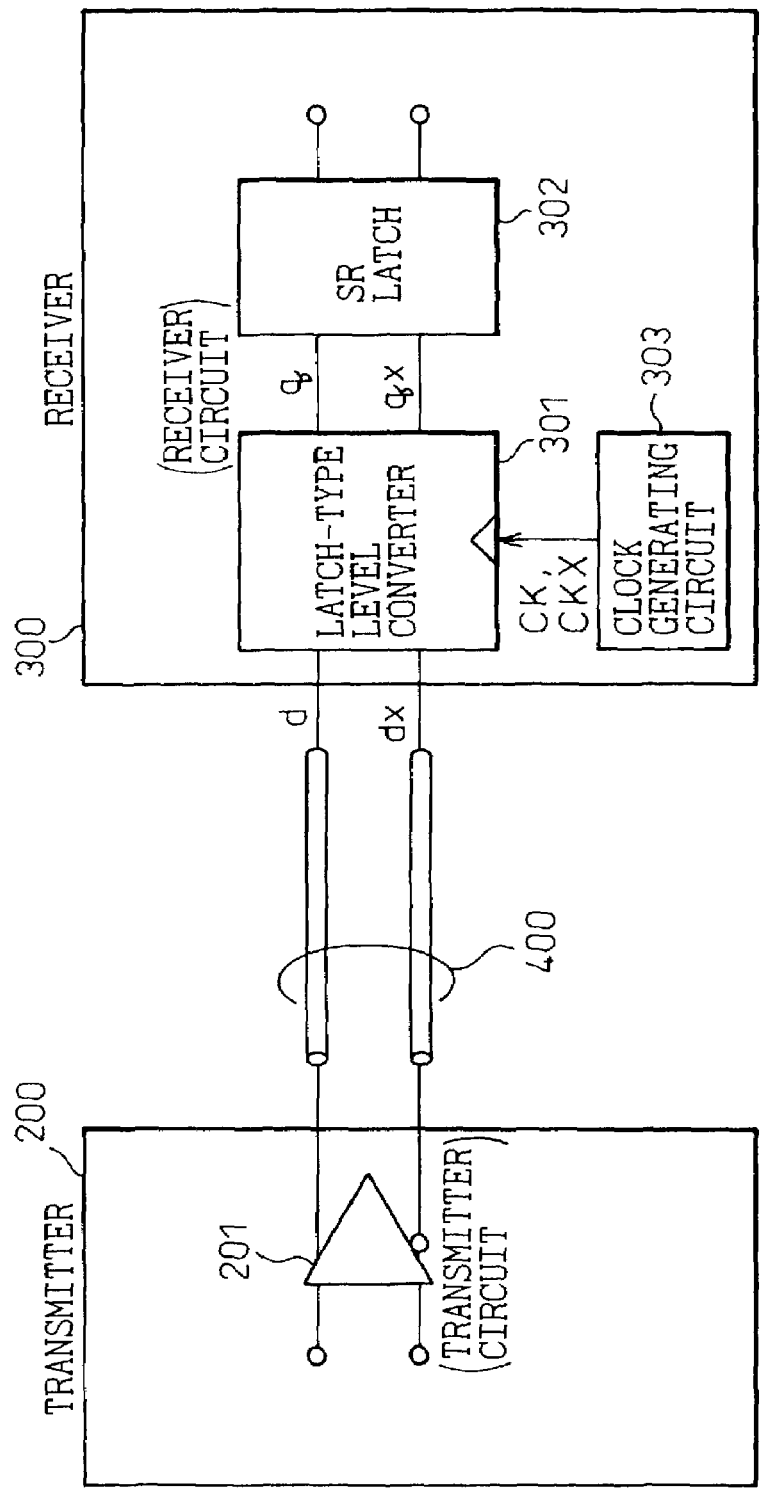
FIG. 8 is a block diagram schematically showing one example of a signal transmission system to which the latch-type level converter of the present invention is applied.

FIG. 8 is a block diagram schematically showing one example of a signal transmission system to which the latch-type level converter of the present invention is applied. In FIG. 8, reference numeral 200 is a transmitter LSI (transmitter circuit), 300 is a receiver LSI (receiver circuit), and 400 is a signal transmission line.

The transmitter LSI 200 comprises a differential transmitter circuit 201, and supplies differential signals (d and dx) to the receiver LSI 300 via the signal transmission line 400. The receiver LSI 300 comprises a latch-type level converter 301, an SR latch 302, and a clock generating circuit 303. The latch-type level converter 301 receives the differential input signals d and dx supplied via the signal transmission line 400 and the output of the clock generating circuit 303 (one or both of the clocks CK and CKX), and supplies differential output signals q and qx to the SR latch 302.

Figure 9:
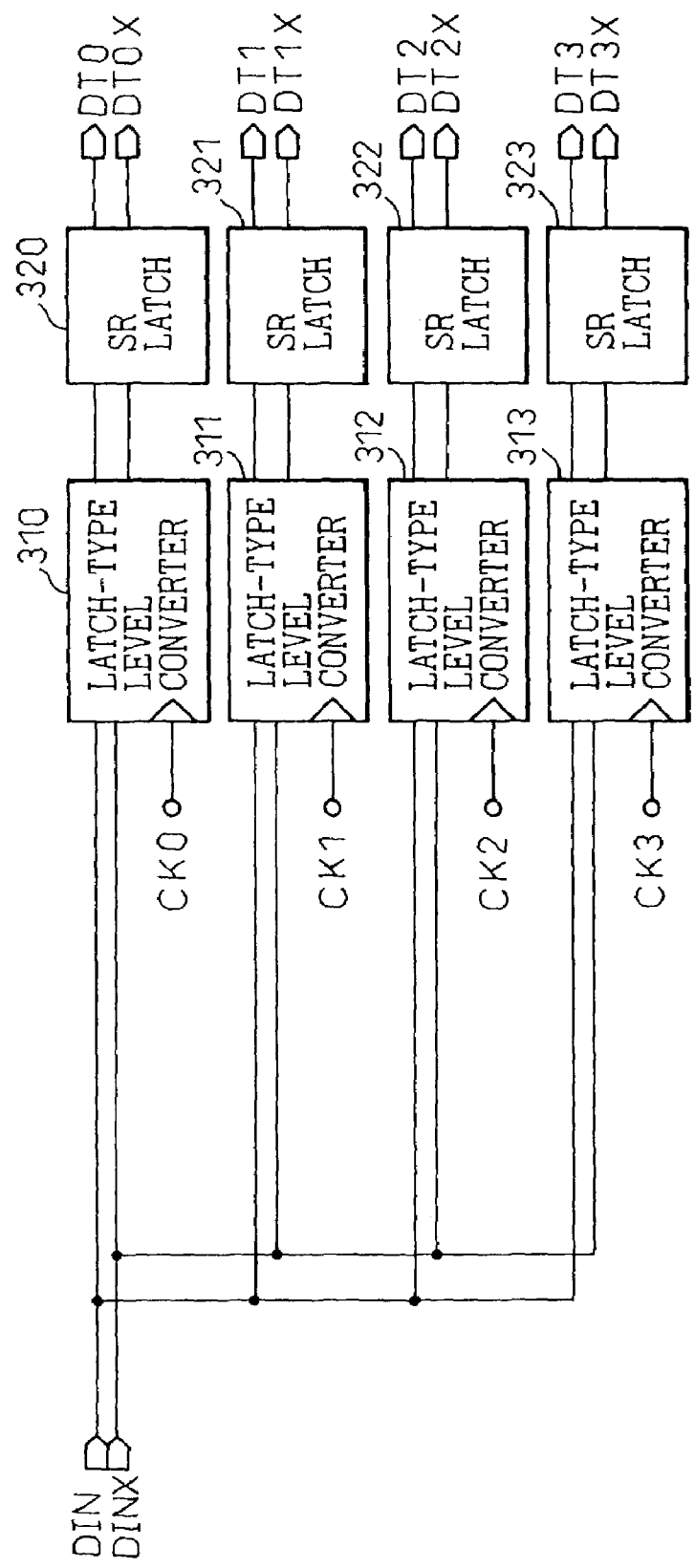
FIG. 9 is a block diagram showing one example of a receiver LSI in the signal transmission system shown in FIG. 8.

FIG. 9 is a block diagram showing one example of the receiver LSI (receiver circuit) in the signal transmission system shown in FIG. 8. In the example shown in FIG. 9, differential input signals DIN and DINX (corresponding to d and dx) are received by four latch-type level converters 310 to 313, and the outputs of the respective latch-type level converters 310 to 313 are fed to the corresponding SR latches 320 to 323 which, in response, produce output signals DT0, DT0X to DT3, DT3X, respectively.

Here, the latch-type level converters 310 to 313 are operated in interleaved fashion by applying, for example, four phase clocks CK0 to CK3 90° apart in phase to the respective level converters. That is, the latch-type level converters 310 to 313 are driven by using clocks CK0 to CK3 slower than the transmission speed of the input signals DIN and DINX.

Figure 10:
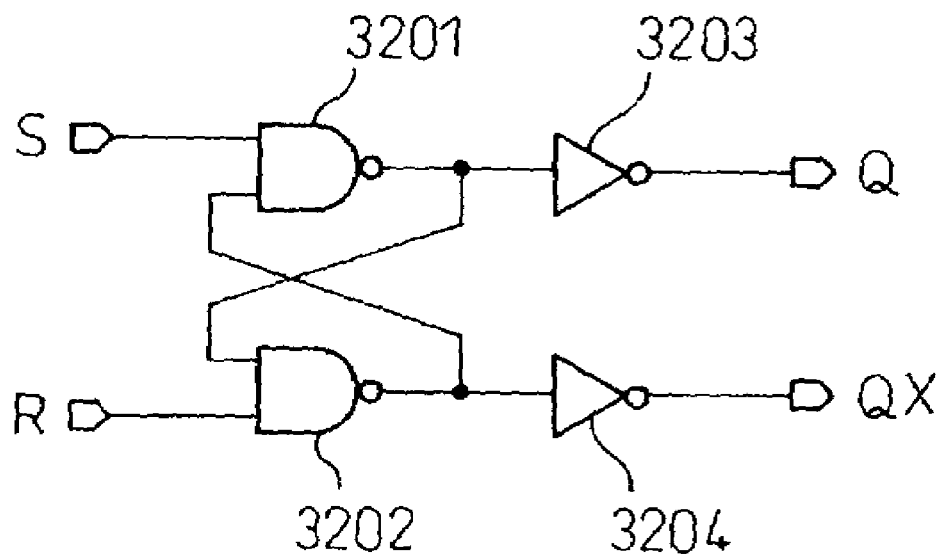
FIG. 10 is a circuit diagram showing one example of an SR latch in the receiver LSI shown in FIG. 9.

FIG. 10 is a circuit diagram showing one example of the SR latch in the receiver LSI shown in FIG. 9.

As shown in FIG. 10, the SR latch 320 (321 to 323) comprises NAND gates 3201 and 3202 and inverters 3203 and 3204. The NAND gates 3201 and 3202 are cross-coupled so as to hold data therein, and the inverters 3203 and 3204 for waveshaping are provided on the output side of the respective NAND gates.

Figure 11:
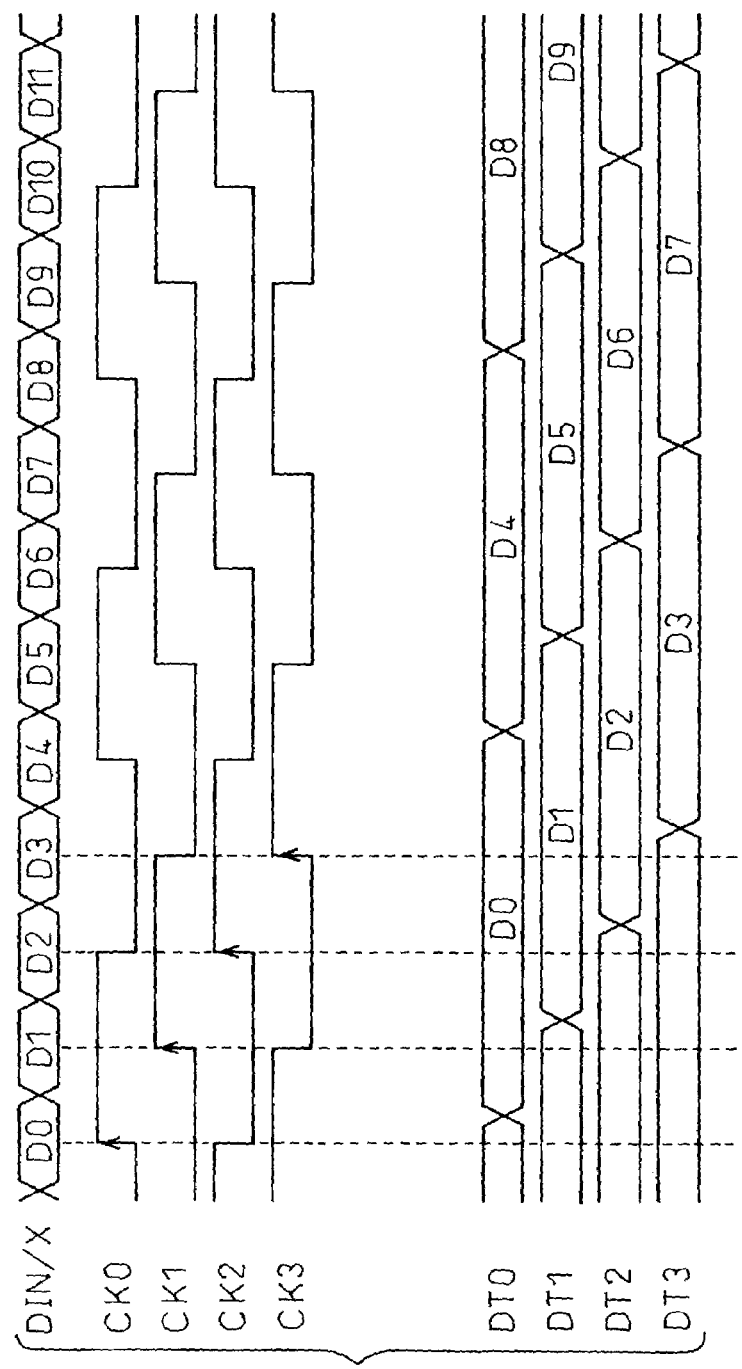
FIG. 11 is a timing diagram for explaining the operation of the receiver LSI shown in FIG. 9.

FIG. 11 is a timing diagram for explaining the operation of the receiver LSI shown in FIG. 9.

As described above, the receiver LSI shown in FIG. 9 is operated in interleaved fashion by the four phase clocks CK0 to CK3; for example, the latch-type level converter 310 is activated by the rising edge of the clock CK0 and latches data D0 of the input signals DIN and DINX, and the outputs of the latch-type level converter 310 are fed to the SR latch 320 which outputs the differential output signals DT0 and DT0X, after which the latch-type level converter 311 is activated by the rising edge of the clock CK1 and latches data D1 of the input signals DIN and DINX, and the outputs of the latch-type level converter 311 are fed to the SR latch 321 which outputs the differential output signals DT1 and DT1X. Further, the latch-type level converter 312 is activated by the rising edge of the clock CK2 and latches data D2 of the input signals DIN and DINX, and the outputs of the latch-type level converter 312 are fed to the SR latch 322 which outputs the differential output signals DT2 and DT2X, and the latch-type level converter 313 is activated by the rising edge of the clock CK3 and latches data D3 of the input signals DIN and DINX, and the outputs of the latch-type level converter 313 are fed to the SR latch 323 which outputs the differential output signals DT3 and DT3X.

Figure 12:
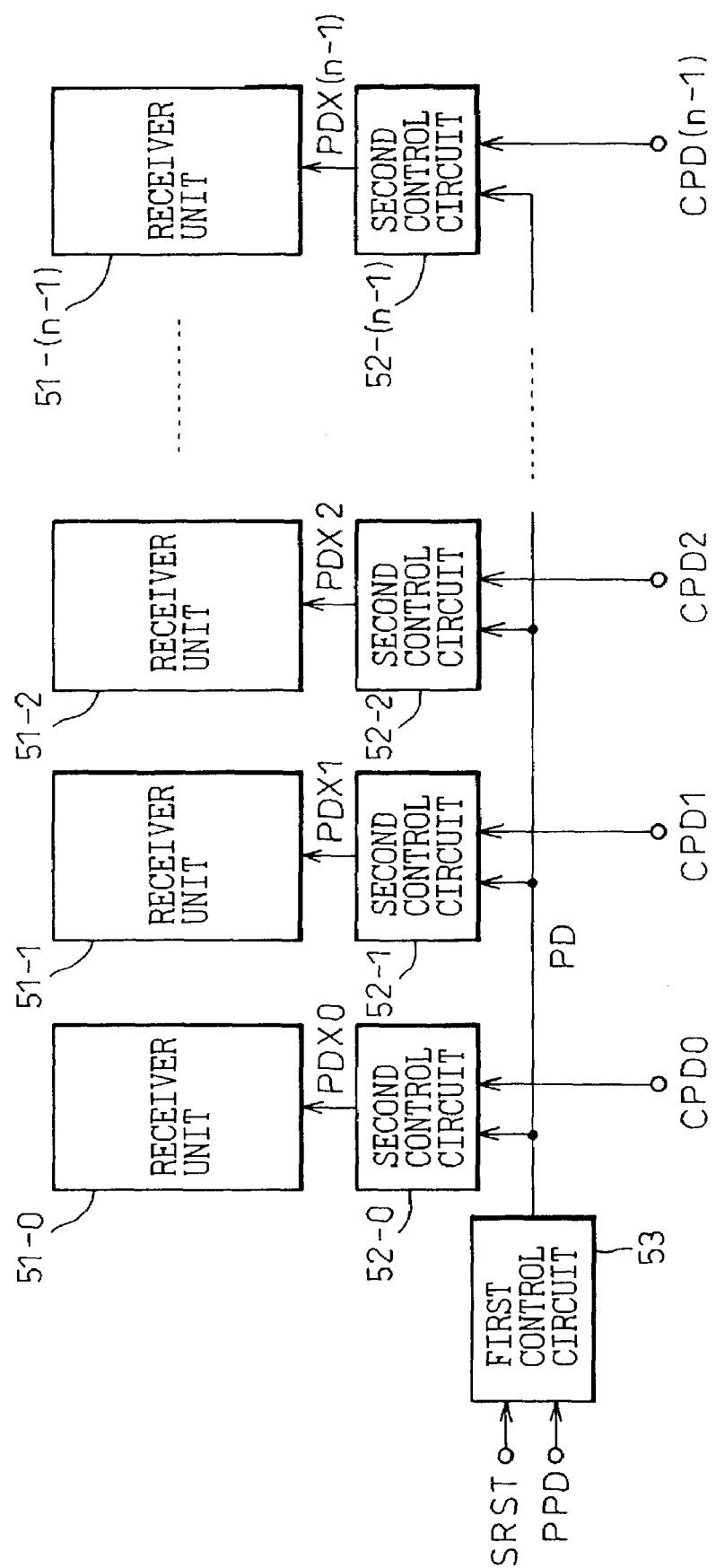
FIG. 12 is a block diagram showing one example of a reset control circuit employed for the receiver LSI shown in FIG. 9.
Figure 13A:
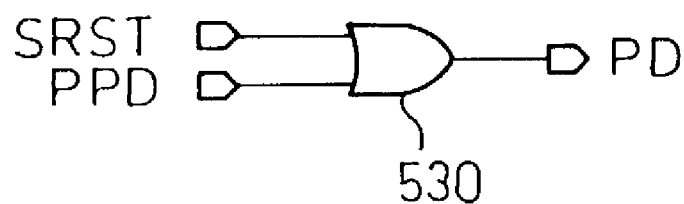
FIGS. 13A and 13B are circuit diagrams each showing an example of a control unit in the reset control circuit shown in FIG. 12.
Figure 13B:
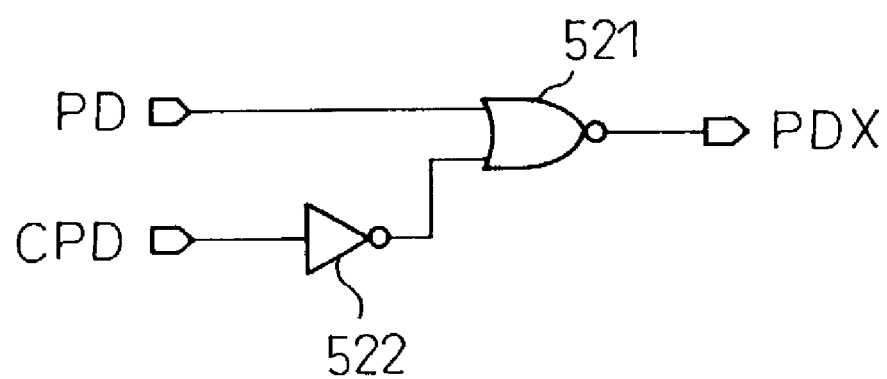

FIG. 12 is a block diagram showing one example of a reset control circuit employed for the receiver LSI shown in FIG. 9, and FIGS. 13A and 13B are circuit diagrams each showing an example of a control unit in the reset control circuit. Here, the receiver LSI shown in FIG. 9 is provided, for example, in each of the n receiver units 51-0 to 51-(n−1).

The reset control circuit shown in FIG. 12 performs reset control by discriminating between three kinds of reset signals. More specifically, the reset control circuit performs reset control based on three kinds of reset signals, that is, a system reset signal SRST (active high) for resetting the entire system, a port power down signal PPD (active high) for resetting all the n receiver units 51-0 to 51-(n−1) in the system, and channel power down signals CPD0 to CPD(n−1) (active low) for resetting the respective receiver units 51-0 to 51-(n−1) individually.

The system reset signal SRST and the port power down signal PPD are supplied to a first control circuit 53, and when either the system reset signal SRST or the port power down signal PPD goes to the reset logic state (high level "H"), the first control circuit 53 determines that the state requires reset, and supplies a reset signal PD (active high) to all second control circuits 52-0 to 52-(n–1). Here, as shown in FIG. 13A, the first control circuit 53 can be constructed, for example, using an OR gate 530 which receives the system reset signal SRST and the port power down signal PPD.

The second control circuits 52-0 to 52-(n–1) each receive the reset signal PD from the first circuit 53 and a corresponding one of the channel power down signals CPD0 to CPD(n–1), and when either the reset signal PD or the corresponding one of the channel power down signals CPD0 to CPD(n–1) goes to the reset logic state (the reset signal PD goes to the high level "H" or the channel power down signal CPD goes to the low level "L"), the corresponding second control circuit determines that the state requires reset, and supplies a corresponding one of reset signals PDX0 to PDX(n–1) (active low) to a corresponding one of the receiver units 51-0 to 51-(n–1). Here, as shown in FIG. 13B, each second control circuit 52 (52-0 to 52-(n–1)) can be constructed, for example, using an inverter 522 which inverts the channel power down signal CPD and a NOR gate 521 which receives the reset signal PD and the channel power down signal CPD inverted by the inverter 522. When the reset signals PDX0 to PDX(n–1) go to the reset logic state (low level "L"), the clock inputs to the corresponding receiver units 51-0 to 51-(n–1) are cut off to stop the operation of the corresponding receiver units 51-0 to 51-(n–1).

The latch-type level converter of the present invention is not limited in application to the receiver circuit system shown in FIGS. 8 to 13, but can be extensively applied to various other apparatuses and systems.

As described in detail above, according to the latch-type level converter of the present invention, not only can low-amplitude signals be accurately amplified, but also input signals having a common-mode voltage higher than the supply voltage can be received.

Many different embodiments of the present invention may be constructed without departing from the spirit and scope of the present invention, and it should be understood that the present invention is not limited to the specific embodiments described in this specification, except as defined in the appended claims.

What is claimed is:

1. A latch-type level converter comprising:
a first clock-input transistor, connected to a first power super line, receiving at a gate thereof a first clock;
a pair of first signal-input transistors receiving at gates thereof differential input signals, wherein each of the first signal-input transistors are coupled to the first clock-input transistor;
a second clock-input transistor, connected to a second power supply line, receiving at a gate thereof a second clock;
a pair of second signal-input transistors receiving at gates thereof the differential input signals, wherein each of the second signal-input transistors are coupled to the second clock-input transistor; and
a latch coupled to each of the first signal-input transistors and each of the second signal-input transistors, wherein:
said latch holds data of the differential input signals received by said first and second pair of signal-input transistors;
the first and second clocks are differential clocks; and
said first and second pair of signal-input transistors are a high-voltage transistor so that said first and second pair of signal-input transistors receives the differential input signals having a voltage greater than a supply voltage which is supplied to said latch.

2. The latch-type level converter as claimed in claim 1, wherein said latch is a pair of cross-coupled inverters.

3. The latch-type level converter as claimed in claim 1, wherein said first power supply line is a highlevel power supply line, said second power supply line is a low-level power supply line, said first clock-input transistor and said pair of first signal-input transistors are pMOS transistors, and said second clock-input transistor and said pair of second signal-input transistors are nMOS transistors.

4. A receiver circuit comprising a latch-type level converter, a latch circuit latching an output of said latch-type level converter, and a clock generating circuit generating first and second clocks to be supplied to said latch-type level converter, wherein said latch-type level converter comprises:
a first clock-input transistor, connected to a first power supply line, receiving at a gate thereof the first clock;
a pair of first signal-input transistors receiving at gates thereof differential input signals, wherein each of the first signal-input transistors are coupled to the first clock-input transistor;
a second clock-input transistor, connected to a second power supply line, receiving at a gate thereof the second clock;
a pair of second signal-input transistors receiving at gates thereof the differential input signals, wherein each of the second signal-input transistors are coupled to the second clock-input transistor; and
a latch coupled to each of the first signal-input transistors and each of the second signal-input transistors, wherein:
said latch holds data of the differential input signals received by said first and second pair of signal-input transistors;
the first and second clocks are differential clocks; and
said first and second pair of signal-input transistors are a high-voltage transistor so that said first and second pair of signal-input transistors receives the differential input signals having a voltage greater than a supply voltage which is supplied to said latch.

5. The receiver circuit as claimed in claim 4, wherein said latch is a pair of cross-coupled inverters.

6. The receiver circuit as claimed in claim 4, wherein said first power supply line is a high-level power supply line, said second power supply line is a low-level power supply line, said first clock-input transistor and said pair of first signal-input transistors are pMOS transistors, and said second clock-input transistor and said pair of second signal-input transistors are nMOS transistors.

7. The receiver circuit as claimed in claim 4, wherein there are a number, n, of said latch-type level converters and the same number, n, of said latch circuits, where n is an integer greater than one, and wherein said n latch-type level converters are respectively driven by nphase differential clocks that said clock generating circuit outputs.

* * * * *